(12) United States Patent
Kyeong et al.

(10) Patent No.: US 11,393,633 B2
(45) Date of Patent: Jul. 19, 2022

(54) MULTILAYER CAPACITOR AND BOARD HAVING THE SAME MOUNTED THEREON

(71) Applicant: SAMSUNG ELECTRO-MECHANICS CO., LTD., Suwon-si (KR)

(72) Inventors: San Kyeong, Suwon-si (KR); Chang Hak Choi, Suwon-si (KR); Jae Seok Yi, Suwon-si (KR); Bon Seok Koo, Suwon-si (KR); Jung Min Kim, Suwon-si (KR); Hae Sol Kang, Suwon-si (KR); Jun Hyeon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 18 days.

(21) Appl. No.: 16/874,885

(22) Filed: May 15, 2020

(65) Prior Publication Data

US 2021/0057160 A1 Feb. 25, 2021

(30) Foreign Application Priority Data

Aug. 23, 2019 (KR) .................. 10-2019-0103742

(51) Int. Cl.
*H01G 4/30* (2006.01)
*H01G 4/012* (2006.01)
*H01G 2/06* (2006.01)
*H01G 4/008* (2006.01)
*H01G 4/12* (2006.01)

(52) U.S. Cl.
CPC ............... *H01G 4/30* (2013.01); *H01G 2/065* (2013.01); *H01G 4/008* (2013.01); *H01G 4/012* (2013.01); *H01G 4/1218* (2013.01)

(58) Field of Classification Search
CPC ............ H01G 4/30; H01G 4/12; H01G 4/248; H01G 4/012; H01G 4/1209; H01G 4/232;
(Continued)

(56) References Cited

U.S. PATENT DOCUMENTS

2006/0035036 A1* 2/2006 Yim .................... C09J 11/04
428/1.1
2013/0201601 A1* 8/2013 Nishisaka ............ H01G 4/2325
361/301.4
(Continued)

FOREIGN PATENT DOCUMENTS

KR 10-2014-0032212 A 3/2014
KR 10-2014-0032294 A 3/2014
(Continued)

OTHER PUBLICATIONS

Korean Office Action dated Oct. 27, 2020 issued in Korean Patent Application No. 10-2019-0103742 (with English translation).

*Primary Examiner* — Michael P McFadden
(74) *Attorney, Agent, or Firm* — Morgan, Lewis & Bockius LLP

(57) ABSTRACT

A multilayer capacitor includes a capacitor body including a dielectric layer and a plurality of internal electrodes, and external electrodes disposed on both ends of the capacitor body and connected to exposed portions of the plurality of internal electrodes, respectively. Each of the external electrodes includes a conductive layer disposed on the capacitor body to be connected to one or more of the plurality of internal electrodes, a conductive resin layer covering the conductive layer, and including a plurality of metal particles, a plurality of elastic fine powder particles each having an elastic powder particle and a metal film plated on a surface of the elastic powder particle, and a conductive resin surrounding the plurality of metal particles and the plurality of (Continued)

elastic fine powder particles and contacting the conductive layer, and a plating layer covering the conductive resin layer.

29 Claims, 8 Drawing Sheets

(58) Field of Classification Search
CPC ... H01G 4/0085; H01G 4/1227; H01G 4/2325
See application file for complete search history.

(56) References Cited

U.S. PATENT DOCUMENTS

| | | | |
|---|---|---|---|
| 2014/0063683 A1 | 3/2014 | Gu et al. | |
| 2015/0022940 A1* | 1/2015 | Han | H01G 4/2325 361/301.4 |
| 2015/0090483 A1* | 4/2015 | Moon | H01G 4/30 174/260 |
| 2015/0209914 A1* | 7/2015 | Ishigami | H01B 1/22 257/99 |
| 2015/0322298 A1* | 11/2015 | Kristiansen | C09J 7/401 428/40.2 |
| 2017/0178811 A1* | 6/2017 | Chun | H01G 4/2325 |
| 2017/0301468 A1* | 10/2017 | Kim | H01G 4/232 |

FOREIGN PATENT DOCUMENTS

| | | |
|---|---|---|
| KR | 10-2015-0080739 A | 7/2015 |
| KR | 10-2017-0118584 A | 10/2017 |
| KR | 10-2019-0094138 A | 8/2019 |

\* cited by examiner

I - I'

MULTILAYER CAPACITOR AND BOARD HAVING THE SAME MOUNTED THEREON

CROSS-REFERENCE TO RELATED APPLICATION(S)

This application claims the benefit under 35 USC 119(a) of Korean Patent Application No. 10-2019-0103742 filed on Aug. 23, 2019 in the Korean Intellectual Property Office, the entire disclosures of which are incorporated herein by reference for all purposes.

TECHNICAL FIELD

The present disclosure relates to a multilayer capacitor and a board having the same mounted thereon.

BACKGROUND

In general, in multilayer capacitors, external electrodes are connected to internal electrodes in parallel, to form an electrical connection with external substrates, and at the same time, serve to protect capacitor bodies from external physical shock or moisture.

However, according to the trend of electric and electronic devices in automobiles, in a multilayer capacitor having special specifications, such as for electric and electronic uses, higher reliability against flexural strength such as physical impacts is required, and thus, there is a need for development of a multilayer capacitor having an external electrode including a novel structure or material with high reliability.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a multilayer capacitor having excellent flexural strength and a board having the same mounted thereon.

According to an aspect of the present disclosure, a multilayer capacitor includes a capacitor body including a dielectric layer and a plurality of internal electrodes, and external electrodes disposed on both ends of the capacitor body and connected to exposed portions of the plurality of internal electrodes, respectively. Each of the external electrodes includes a conductive layer disposed on the capacitor body to be connected to one or more of the plurality of internal electrodes, a conductive resin layer covering the conductive layer, and including a plurality of metal particles, a plurality of elastic fine powder particles each having an elastic powder particle and a metal film plated on a surface of the elastic powder particle, and a resin surrounding the plurality of metal particles and the plurality of elastic fine powder particles and contacting the conductive layer, and a plating layer covering the conductive resin layer.

The metal particles of the conductive resin layer may include spherical or flake type powder particles.

The elastic powder particles of the conductive resin layer may be provided as a polymer material.

The elastic powder particles of the conductive resin layer may be provided as a resin-based material.

The metal film of the elastic fine powder particles of the conductive resin layer may include at least one or more of nickel (Ni), copper (Cu), and silver (Ag).

The elastic fine powder particles of the conductive resin layer may be spherical.

The elastic fine powder particles of the conductive resin layer may be flake type powder particles.

A portion of the elastic fine powder particles of the conductive resin layer may be spherical, and the remainder may be a flake type powder particle.

The elastic fine powder particles of the conductive resin layer may have a diameter of 1.0 to 10.0 micrometers.

In the elastic fine powder particles of the conductive resin layer, a thickness of the metal film may be $1/20$ to $1/3$ of a diameter of the elastic powder particle.

In the elastic fine powder particles disposed in the conductive resin layer, the metal film may react with the metal particles to form an alloy.

The multilayer capacitor may further include an alloy, containing a material of the metal film and a material of the plurality of metal particles, directly connecting the metal film of one of the plurality of the elastic fine powder particles and one of the plurality of metal particles to each other.

The multilayer capacitor may further include an alloy, containing a material of the metal film and a material of the plurality of metal particles, being in direct contact with one of the elastic powder particles and one of the plurality of metal particles.

The plating layer may include a nickel plating layer covering the conductive resin layer, and a tin (Sn) plating layer covering the nickel plating layer.

An elastic modulus of the elastic powder particles may be less than that of the resin.

According to an aspect of the present disclosure, a board having a multilayer capacitor mounted thereon includes a substrate having electrode pads spaced apart from each other on one surface thereof, and the multilayer capacitor mounted in such a manner that external electrodes are mounted on electrode pads to be connected to each other, respectively.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
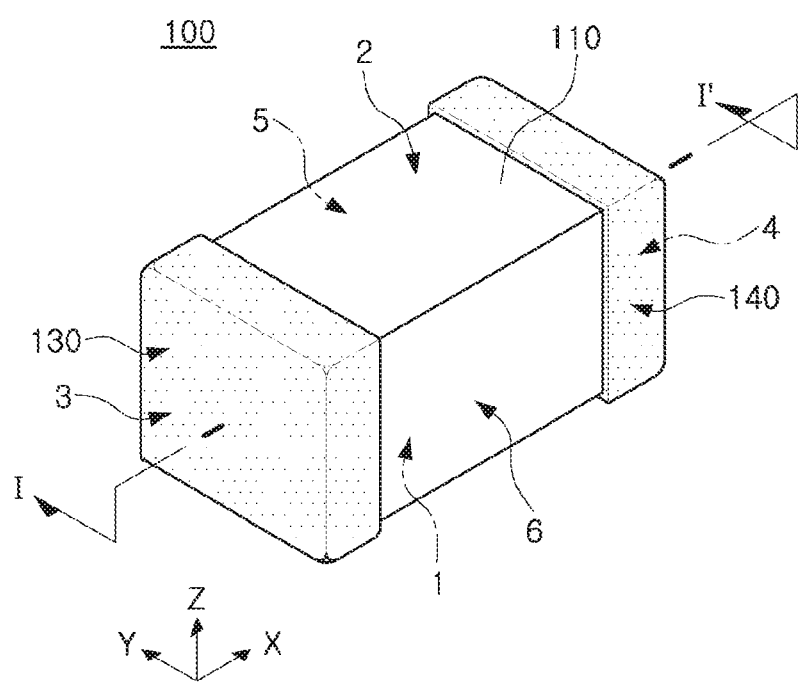
FIG. 1 is a perspective view schematically illustrating a multilayer capacitor according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

Hereinafter, when defining the direction of the capacitor body 110 to clearly describe the embodiment of the present disclosure, X, Y and Z illustrated in the drawing indicates the length direction, width direction and thickness direction of the capacitor body 110, respectively. In addition, in this embodiment, the Z direction may be used in the same concept as the stacking direction in which dielectric layers are stacked.

Figure 2A:
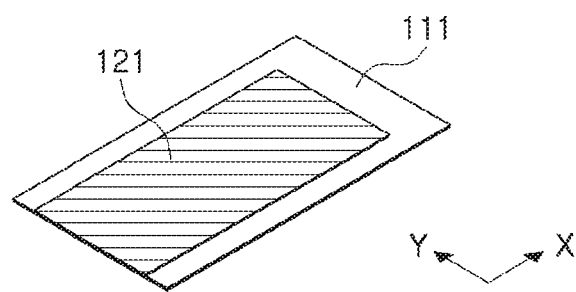
FIGS. 2A and 2B are plan views illustrating first and second internal electrodes applied to the multilayer capacitor of FIG. 1, respectively.
Figure 2B:
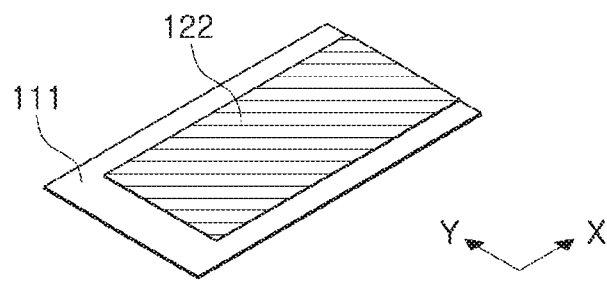
Figure 3:
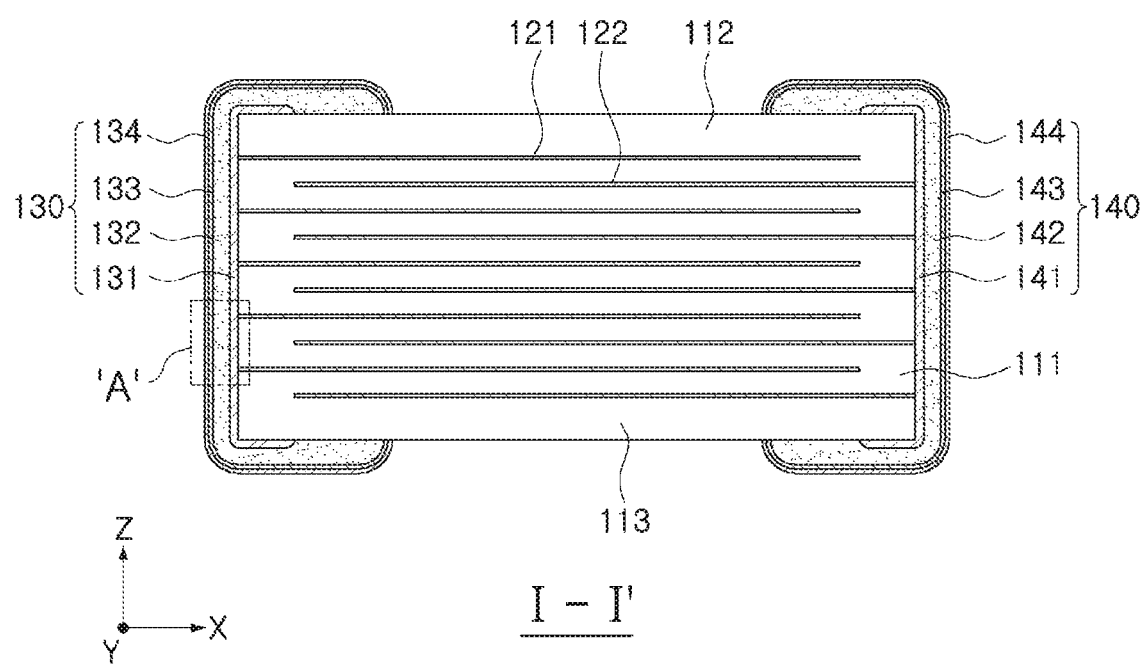
FIG. 3 is a cross-sectional view taken along line I-I' of FIG. 1.
Figure 4:
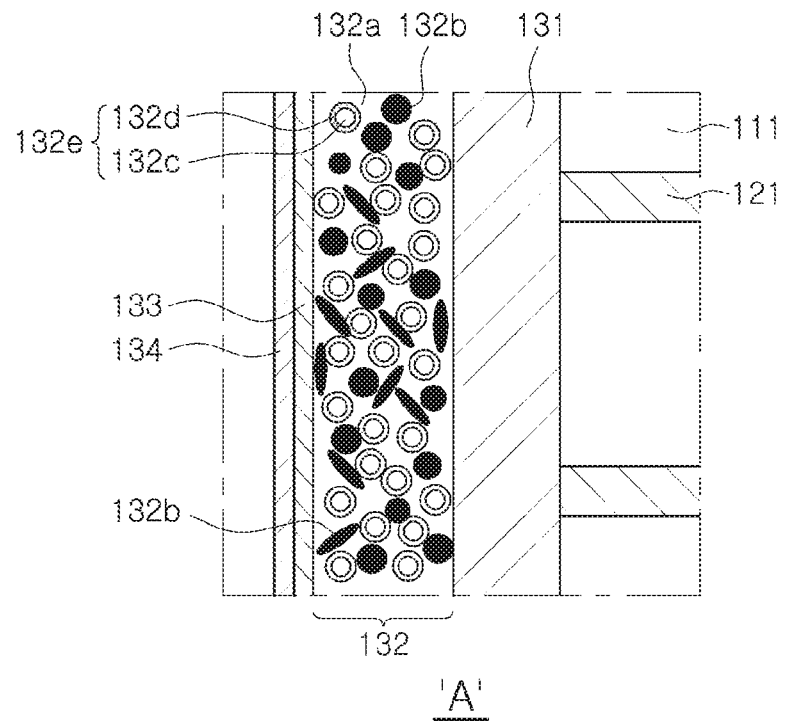
FIG. 4 is an enlarged cross-sectional view of portion A of FIG. 3.

FIG. 1 is a perspective view schematically illustrating a multilayer capacitor according to an embodiment, and FIGS. 2A and 2B are plan views illustrating first and second internal electrodes applied to the multilayer capacitor of FIG. 1, respectively. FIG. 3 is a cross-sectional view taken along line I-I' of FIG. 1, and FIG. 4 is an enlarged cross-sectional view of portion A of FIG. 3.

Referring to FIGS. 1 to 4, a multilayer capacitor 100 according to an embodiment includes a capacitor body 110 and first and second external electrodes 130 and 140.

The capacitor body 110 is obtained by stacking a plurality of dielectric layers 111 in the Z direction, followed by firing, and the dielectric layers 111 may be integrated with each other to such an extent that it is difficult to confirm a boundary between the dielectric layers 111 of the capacitor body 110, adjacent to each other, without using a scanning electron microscope (SEM).

In this case, the capacitor body 110 may be generally hexahedral, but an embodiment thereof is not limited thereto. The shape and the dimensions of the capacitor body 110, and the number of stacked layers of the dielectric layer 111 are not limited to those illustrated in the drawings of this embodiment.

In this embodiment, for convenience of description, both surfaces of the capacitor body 110 opposing each other in the Z direction may be defined as first and second surfaces 1 and 2, both surfaces of the capacitor body 110 connected to the first and second surfaces 1 and 2 and opposing each other in the X direction may be defined as third and fourth surfaces 3 and 4, and both surfaces thereof connected to the first and second surfaces 1 and 2, connected to the third and fourth surfaces 3 and 4 and opposing each other in the Y direction may be defined as fifth and sixth surfaces 5 and 6. In this embodiment, the mounting surface of the multilayer capacitor 100 may be the first surface 1 of the capacitor body 110.

The dielectric layer 111 may include a ceramic material having a high dielectric constant, and may include, for example, barium titanate ($BaTiO_3$)-based or strontium titanate ($SrTiO_3$)-based ceramic powder, but as long as sufficient capacitance can be obtained, the material of the dielectric layer 111 is not limited thereto.

A ceramic additive, an organic solvent, a plasticizer, a binder, a dispersant, and the like may be further added to the dielectric layer 111.

As the ceramic additive, for example, transition metal oxide or transition metal carbide, a rare earth element, magnesium (Mg) or aluminum (Al) may be used.

The capacitor body 110 may include an active region as a part contributing to the capacitance formation of the capacitor, and upper and lower covers 112 and 113 formed on upper and lower portions of the active region in the Z direction as upper and lower margins, respectively.

The upper and lower covers 112 and 113 may have the same material and configuration as those of the dielectric layer 111 except for not including internal electrodes.

The upper and lower covers 112 and 113 may be formed of a single dielectric layer or by stacking two or more dielectric layers on the upper and lower surfaces of the active region in the Z direction, respectively, and basically, may serve to prevent damage to the first and second internal electrodes 121 and 122 by physical or chemical stress.

The first and second internal electrodes 121 and 122 are electrodes that receive different polarities, and are alternately disposed in the Z direction with the dielectric layer 111 interposed therebetween, and one ends of the first and second internal electrodes 121 and 122 may be exposed through the third and fourth surfaces 3 and 4 of the capacitor body 110, respectively.

In this case, the first and second internal electrodes 121 and 122 may be electrically insulated from each other by the dielectric layer 111 disposed therebetween.

The end portions of the first and second internal electrodes 121 and 122 alternately exposed through the third and fourth surfaces 3 and 4 of the capacitor body 110 may be electrically connected to the first and second external electrodes 130 and 140 disposed on the third and fourth surfaces 3 and 4 of the capacitor body 110, respectively.

According to the above configuration, when a predetermined voltage is applied to the first and second external electrodes 130 and 140, charges are accumulated between the first and second internal electrodes 121 and 122.

In this case, the capacitance of the multilayer capacitor 100 is proportional to the overlapped area of the first and second internal electrodes 121 and 122 overlapping each other in the Z direction in the active region.

The material of the first and second internal electrodes 121 and 122 is not particularly limited. For example, the first and second internal electrodes 121 and 122 may be formed using a precious metal material such as platinum (Pt), palladium (Pd), and a palladium-silver (Pd—Ag) alloy and a conductive paste formed of at least one of nickel (Ni) and copper (Cu).

In this case, as the printing method of the conductive paste, a screen printing method, a gravure printing method or the like may be used, but an embodiment thereof is not limited thereto.

The first and second external electrodes 130 and 140 may be provided with voltages having different polarities, may be disposed on both end portions of the capacitor body 110 in the X direction, and may be electrically connected to exposed portions of the first and second internal electrodes 121 and 122, respectively.

In this case, the first and second external electrodes 130 and 140 include first and second conductive layers 131 and 141 formed on surfaces of the capacitor body 110 to be connected to the first and second internal electrodes 121 and 122, respectively, first and second conductive resin layers 132 and 142 formed to cover the first and second conductive layers 131 and 141, respectively, and first and second plating layers formed to cover the first and second conductive resin layers 132 and 142, respectively.

The first conductive layer 131 may include a first connection portion and a first band portion.

The first connection portion is a portion formed on the third surface 3 of the capacitor body 110 to be connected to the exposed portion of the first internal electrode 121, and the first band portion is a portion extending from the first connection portion to a portion of the first surface 1 of the capacitor body 110.

In this case, the first band portion may further extend to portions of the fifth and sixth surfaces 5 and 6 and a portion of the second surface 2 of the capacitor body 110 to improve fixing strength.

The second conductive layer 141 may include a second connection portion and a second band portion.

The second connection portion is a portion formed on the fourth surface 4 of the capacitor body 110 to be connected to the exposed portion of the second internal electrode 122, and the second band portion is a portion extending to from the second connection portion to a portion of the first surface 1 of the capacitor body 110.

In this case, the second band portion may further extend to portions of the fifth and sixth surfaces 5 and 6 and a portion of the second surface 2 of the capacitor body 110 to improve fixing strength.

The first and second conductive layers 131 and 141 may include at least one of copper (Cu) and silver (Ag), and may further include glass, epoxy, and the like.

The first and second conductive resin layers 132 and 142 are formed to cover the first and second conductive layers 131 and 141, respectively.

FIG. 4 is a partially enlarged view of portion A of the first external electrode 130 in FIG. 3, and there is only a difference in that the first external electrode 130 is electrically connected to the first internal electrode 121 and the second external electrode 140 is connected to the second internal electrode 122, but the configuration of the first external electrode 130 and the second external electrode 140 is similar. Thus, it will be described based on the first external electrode 130 below and this description includes the description of the second external electrode 140.

Referring to FIG. 4, the first conductive resin layer 132 includes a plurality of metal particles 132b, a plurality of elastic fine powder particle 132e having elastic powder particles 132c and metal films 132d plated with a metal on the surfaces of the elastic powder particles 132c, and a resin 132a surrounding the plurality of metal particles 132b and the plurality of elastic fine powder particle 132e and in contact with the first conductive layer 131.

The resin 132a may be one of polymer resins such as epoxy, acryl and the like.

The conductive resin 132a may be one of polymer resins such as epoxy, acryl and the like.

The metal particles 132b of the first conductive resin layer 132 may be formed in a spherical shape or a flake shape.

In this embodiment, the metal particles 132b of the first conductive resin layer 132 are illustrated as having a structure in which a spherical shape and a flake shape are mixed, but an embodiment thereof is not limited thereto. For example, the metal particles disposed on the conductive resin layer may all be spherical or all flake-shaped.

The metal particles 132b may be formed of at least one or two or more alloys of copper (Cu), silver (Ag), and tin (Sn).

The elastic powder particles 132c of the first conductive resin layer 132 may be a polymer material having excellent elasticity.

As another example, the elastic powder particles 132c of the first conductive resin layer 132 may be a resin-based material having excellent elasticity. An elastic modulus or Young's modulus of the elastic powder particles 132c may be less than that of the resin 132a.

The metal film 132d of the elastic fine powder particle 132e of the first conductive resin layer 132 may include at least one of Ni, Cu, and Ag.

The elastic fine powder particle 132e of the first conductive resin layer 132 may be spherical to have excellent elasticity.

In addition, the elastic fine powder particle 132e of the first conductive resin layer 132 may have a diameter of 1.0 to 10.0 μm.

If the diameter of the elastic fine powder particle 132e is less than 1.0 μm, since the specific surface area is increased and the elastic powder particle particles are thus densely accumulated, flexural strength characteristics may be degraded.

If the diameter of the elastic fine powder particle 132e exceeds 10.0 μm, since the volume of the resin 132a in the first conductive resin layer 132 is relatively too large, deterioration of conductivity may occur.

In the first conductive resin layer 132, in the case of the elastic fine powder particle 132e, the thickness of the metal film 132d may be 1/20 to 1/3 of the diameter of the elastic particle 132c.

If the thickness of the metal film 132d is less than 1/20 of the diameter of the elastic particle 132c, conductivity decreases, and if the thickness of the metal film 132d exceeds 1/3 of the diameter of the elastic particle 132c, the degree to which flexural strength characteristics are improved may be insufficient.

Figure 5:
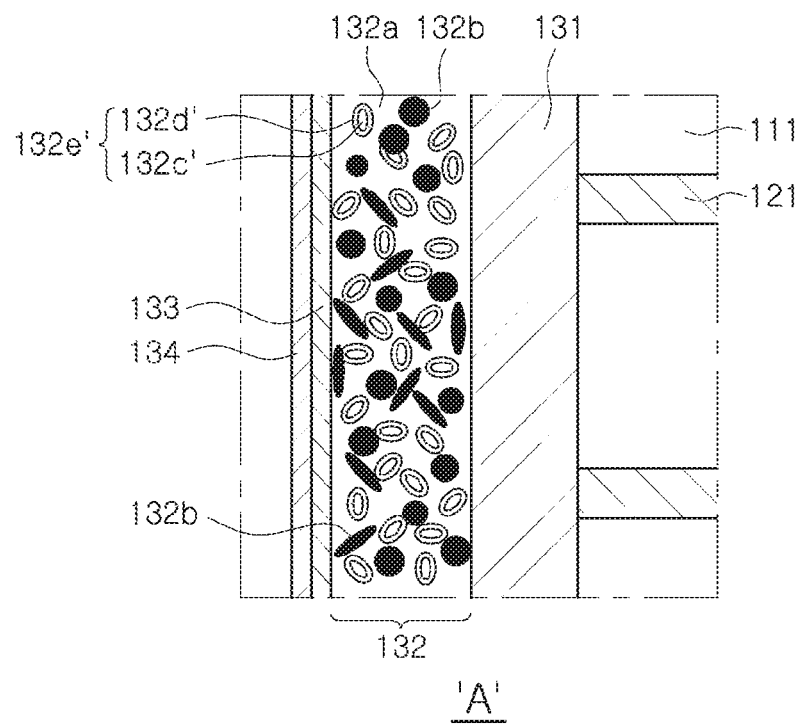
FIG. 5 is an enlarged cross-sectional view illustrating portion A of FIG. 3 according to another embodiment of the conductive resin layer.

On the other hand, in an embodiment of the present disclosure, as illustrated in FIG. 5, an elastic fine powder particle 132e' of a first conductive resin layer 132 may be a flake type powder particle having excellent elasticity.

In this case, elastic powder particles 132c' and a metal film 132d' of the elastic fine powder particle 132e' may also be formed in a flake shape.

Figure 6:
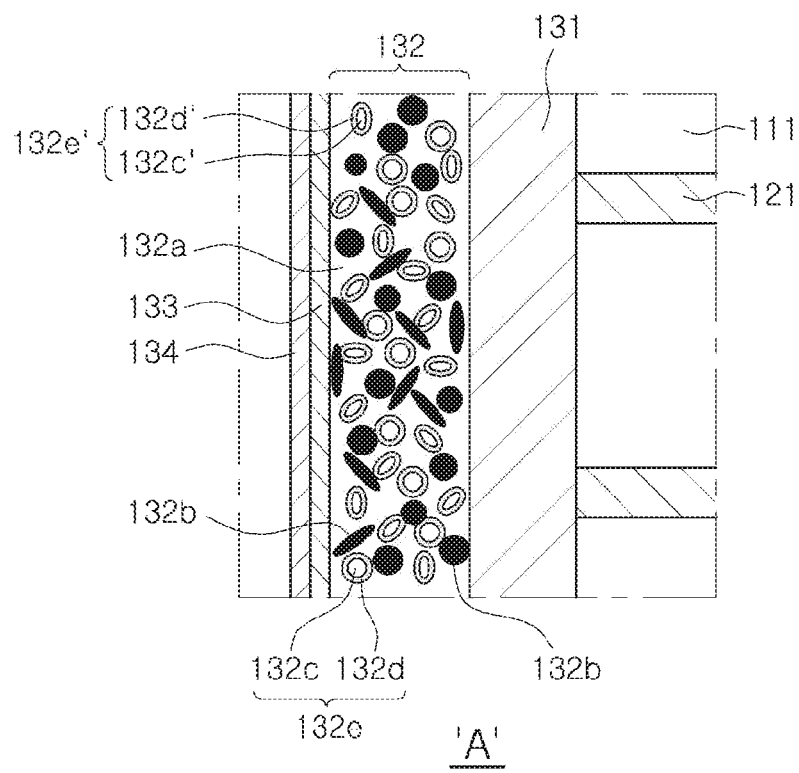
FIG. 6 is an enlarged cross-sectional view illustrating portion A of FIG. 3 according to another embodiment of the conductive resin layer.

As another example, as illustrated in FIG. 6, an elastic powder particle of a first conductive resin layer 132 may be partially formed in a spherical shape, and the remainder may be formed in a flake shape. Thus, the spherical elastic fine powder particle 132e and the flake elastic fine powder particle 132e' may be configured to be mixed in the resin 132a.

The first and second plating layers may include first and second nickel (Ni) plating layers 133 and 143 covering the first and second conductive resin layers 132 and 142, respectively, and first and second tin (Sn) plating layers 134 and 144 covering the first and second nickel plating layers 133 and 143, respectively.

A related art multilayer capacitor may be formed of a double layer by forming an internal layer for electrically connecting an external electrode to an internal electrode and by forming an external layer for alleviating external shock and improving moisture resistance characteristics on the internal layer.

In detail, in the case of a multilayer capacitor for electric and electronic uses, an external layer of an external electrode may mitigate a physical shock transmitted externally, such as vibrations.

The external layer is mainly composed of an epoxy-based polymer and a metal filler such as copper and silver, and has conductivity and elastic characteristics.

However, in the case of electric and electronic components, high durability against external shocks is required, and related art structures have limitations in meeting such high levels of durability.

In the multilayer capacitor according to this embodiment, a plurality of elastic fine particles are disposed in the resin of the conductive resin layer, and the elastic powder particles of the elastic powder particle act as a buffer in the event of an external impact, thereby significantly alleviating external impact and thus increasing flexural strength durability of the multilayer capacitor.

In detail, in the related art multilayer capacitor, in a case in which the polymer content of the external layer is increased, the durability of the external electrode may be partially improved, but as the content of the polymer increases, a problem in which the electrical connectivity and the plating properties when forming the external plating layer are deteriorated may occur.

However, according to the embodiment of the present disclosure, by the high elastic powder particles included in the elastic powder particle, the durability to the flexural strength of the multilayer capacitor may be improved, and the surface of the elastic powder particle is plated with a conductive metal to form the metal film. Thus, the problems of a drop in electrical connectivity and a drop in plating properties occurring in the related art structure may be compensated.

Figure 7:
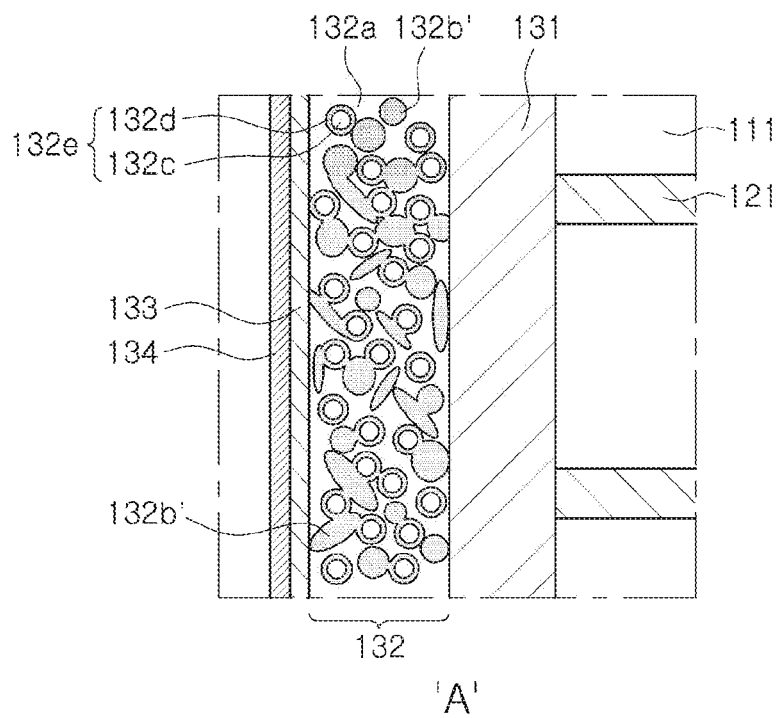
FIG. 7 is an enlarged cross-sectional view of portion A of FIG. 3 according to another embodiment of the conductive resin layer.
Figure 8:
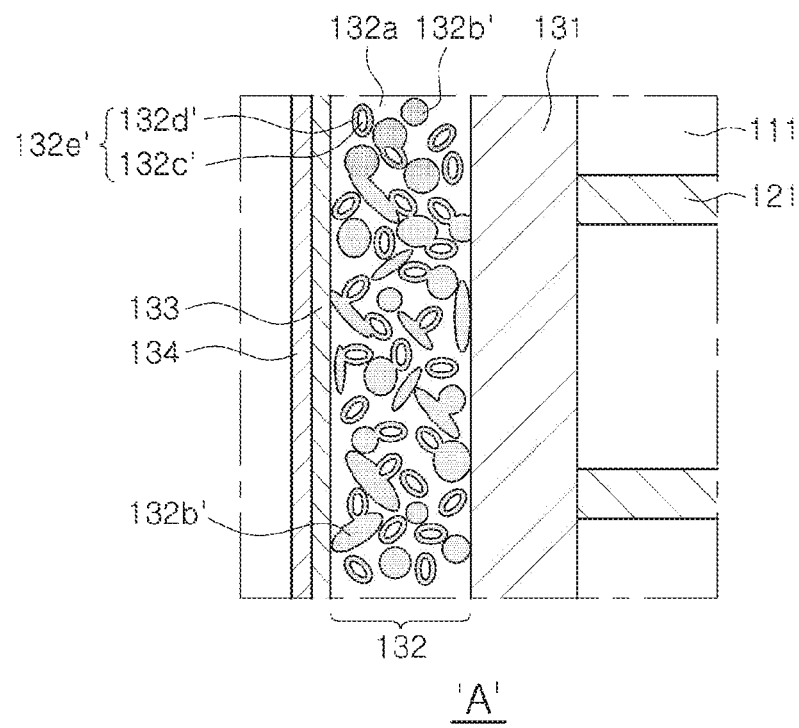
FIG. 8 is an enlarged cross-sectional view of portion A of FIG. 3 according to another embodiment of the conductive resin layer.
Figure 9:
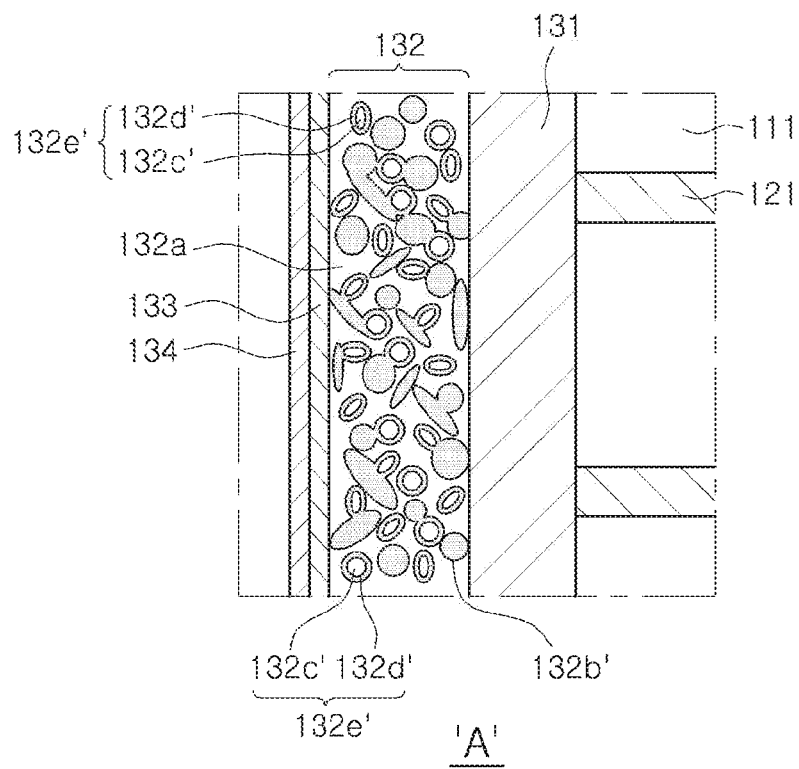
FIG. 9 is an enlarged cross-sectional view of portion A of FIG. 3 according to another embodiment of the conductive resin layer.

FIG. 7 is an enlarged cross-sectional view of portion A of FIG. 3 according to another embodiment of the conductive resin layer. FIG. 8 is an enlarged cross-sectional view of portion A of FIG. 3 according to another embodiment of the conductive resin layer. FIG. 9 is an enlarged cross-sectional view of portion A of FIG. 3 according to another embodiment of the conductive resin layer.

Referring to FIG. 7, in this embodiment, the elastic fine powder particle 132e disposed in the conductive resin layer 132 may have the form of an alloy as the metal film 132d reacts with metal particles 132b' disposed in the conductive resin layer 132. For example, an alloy containing a material of the metal film 132d and a material of the metal particles 132b' may directly connect the metal film of one of the elastic fine powder particles 132e and one of the metal particles 132b' to each other. For another example, an alloy containing a material of the metal film 132d and a material of the metal particles 132b' may be in direct contact with one of the elastic powder particles 132c.

As described above, when the metal film 132d of the elastic fine powder particle 132e reacts with the metal particles 132b' disposed in the conductive resin layer 132 to form an alloy, in the case of the external electrode 130, an electrical connection path directly connected via a metal, from the conductive layer 131 connected to the internal electrode 121, to the plating layer 133 covering the conductive resin layer 132, may be formed, thereby further improving conductivity, compared to the structure of FIG. 4.

In addition, since the elastic powder particles 132c of the elastic fine powder particle 132e may prevent the deterioration of the flexural strength characteristics, even in a case in which the metal film 132d and the metal particles 132b' are connected to each other, conductivity may be improved without deterioration in flexural strength characteristics.

FIG. 8 is a drawing illustrating a structure in which the elastic fine powder particle 132e' has a flake-shaped elastic particle 132c' and a flake-shaped metal film 132d', and FIG. 9 is a diagram illustrating a structure in which the elastic powder particles 132e and 132e' are mixed with flake and spherical shapes.

Figure 10:
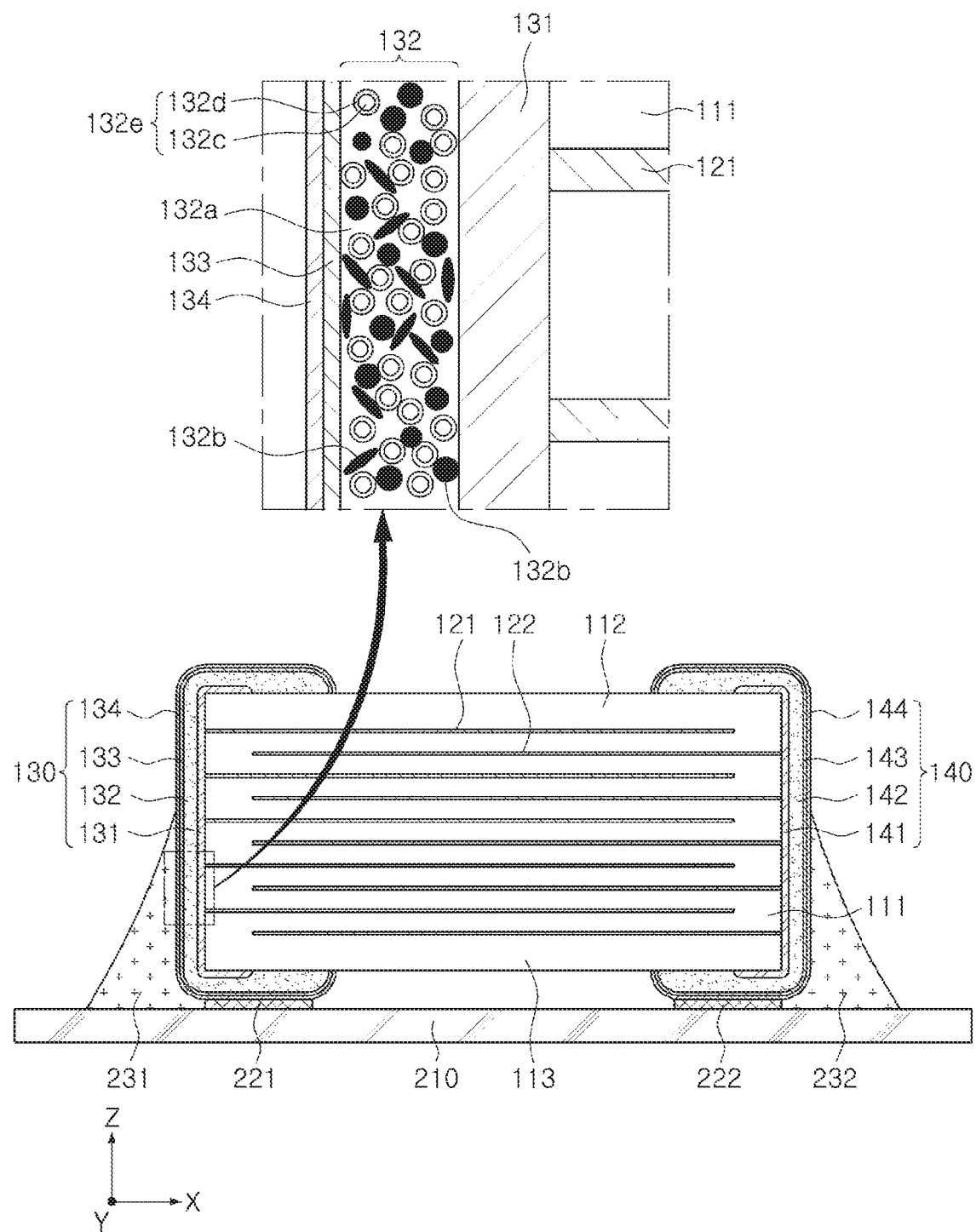
FIG. 10 is a cross-sectional view schematically illustrating a state in which the multilayer capacitor of FIG. 4 is mounted on a substrate.
Figure 11:
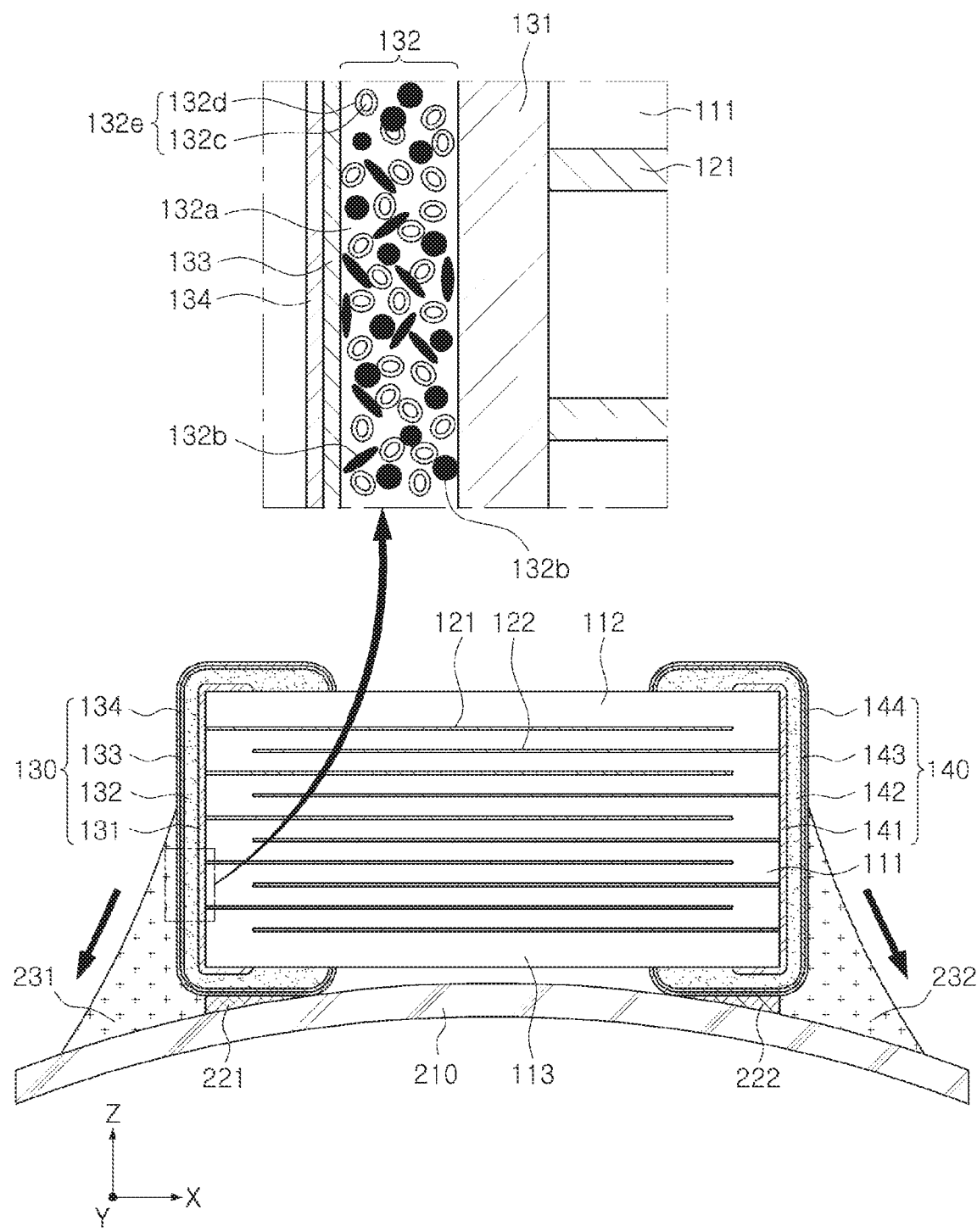
FIG. 11 is a cross-sectional view schematically illustrating a state in which a substrate is bent by applying force from a lower side of the substrate of FIG. 10.

FIG. 10 is a cross-sectional view schematically illustrating a state in which the multilayer capacitor of FIG. 4 is mounted on a substrate, and FIG. 11 is a cross-sectional view schematically illustrating a state in which a substrate is bent by applying force from a lower side of the substrate of FIG. 10.

Referring to FIG. 10, a board having the multilayer capacitor mounted thereon according to this embodiment may include a substrate 210 having first and second electrode pads 221 and 222 on one surface thereof, and a multilayer capacitor 100 mounted on an upper surface of the substrate 210 in such a manner that the first and second external electrodes 130 and 140 are connected to the first and a second electrode pads 221 and 222, respectively.

Although the multilayer capacitor 100 is illustrated as being mounted on the substrate 210 by solders 231 and 232, a conductive paste may be used instead of solder if necessary.

In this case, as illustrated in FIG. 11, when a force or an impact is applied to the substrate 210 from one side thereof, the substrate 210 is bent. At this time, the force or the impact is transmitted to the capacitor body 110, and the first or second external electrode 130 or 140 may be detached from the capacitor body 110, or severely, cracks may occur in the capacitor body 110.

In the 6 mm flexural impact test, in the case of related art multilayer capacitor having an external electrode in which elastic fine powder is not contained in a conductive resin layer, 8 out of 30 samples had cracked.

However, according to the embodiment of the present disclosure, the elastic powder particles of the elastic fine powder contained in the conductive resin layer of the external electrode have high elasticity, so that the external force or impact is buffered and absorbed through the elasticity of the elastic powder particles and the deformation that is compressed. Therefore, the bending strength characteristics and durability of the multilayer capacitor 100 against external force or impacts may be improved, such as failure of the 30 samples in the 6 mm bending shock test does not occur.

As set forth above, according to an embodiment, a multilayer capacitor has an effect of increasing reliability of flexural strength characteristics by increasing the elasticity of an external electrode without deteriorating electrical connectivity.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multilayer capacitor comprising:
    a capacitor body including a dielectric layer and a plurality of internal electrodes; and
    external electrodes disposed on both ends of the capacitor body and connected to exposed portions of the plurality of internal electrodes, respectively,
    wherein each of the external electrodes includes:
    a conductive layer disposed on the capacitor body to be connected to one or more of the plurality of internal electrodes;
    a conductive resin layer covering the conductive layer, and including a plurality of metal particles, a plurality of particles of a polymer material or of a resin-based material having a metal film disposed on a surface thereof, and a resin surrounding the plurality of metal particles and the plurality of particles of the polymer material or of the resin-based material;
    a plating layer covering the conductive resin layer; and
    an alloy, containing a material of the metal film and a material of the plurality of metal particles, directly connecting one of the plurality of metal particles and the metal film of one of the plurality of particles of the polymer material or of the resin-based material to each other.

2. The multilayer capacitor of claim 1, wherein the metal particles of the conductive resin layer include a spherical or flake type powder particles.

3. The multilayer capacitor of claim 1, wherein the metal film comprises at least one or more of nickel (Ni), copper (Cu), and silver (Ag).

4. The multilayer capacitor of claim 1, wherein the plurality of particles of the polymer material or of the resin-based material are spherical.

5. The multilayer capacitor of claim 1, wherein the plurality of particles of the polymer material or of the resin-based material are flake type powder particles.

6. The multilayer capacitor of claim 1, wherein a portion of the plurality of particles of the polymer material or of the resin-based material is spherical, and the remainder is a flake type powder particle.

7. The multilayer capacitor of claim 1, wherein the plurality of particles of the polymer material or of the resin-based material have a diameter of 1.0 to 10.0 micrometers.

8. The multilayer capacitor of claim 1, wherein a thickness of the metal film is 1/20 to 1/3 of a diameter of a respective one of the plurality of particles of the polymer material or of the resin-based material.

9. The multilayer capacitor of claim 1, wherein the metal film reacts with the metal particles to form the alloy.

10. The multilayer capacitor of claim 1, wherein the alloy is in direct contact with the one of the plurality of particles of the polymer material or of the resin-based material and the one of the plurality of metal particles.

11. The multilayer capacitor of claim 1, wherein the plating layer comprises a nickel plating layer covering the conductive resin layer, and a tin (Sn) plating layer covering the nickel plating layer.

12. The multilayer capacitor of claim 1, wherein an elastic modulus of the particles of the polymer material or of the resin-based material is less than that of the conductive resin.

13. A board having a multilayer capacitor mounted thereon, the board comprising:
a substrate having electrode pads spaced apart from each other on one surface of the substrate; and
the multilayer capacitor of claim 1, wherein the multilayer capacitor is mounted in such a manner that the external electrodes are mounted on the electrode pads to be connected to each other, respectively.

14. A multilayer capacitor comprising:
a capacitor body including a dielectric layer and a plurality of internal electrodes; and
external electrodes disposed on both ends of the capacitor body and connected to exposed portions of the plurality of internal electrodes, respectively,
wherein each of the external electrodes includes:
a conductive layer disposed on the capacitor body to be connected to one or more of the plurality of internal electrodes;
a conductive resin layer covering the conductive layer, and including a plurality of metal particles, a plurality of particles of a polymer material or of a resin-based material having a metal film disposed on a surface thereof, and a resin surrounding the plurality of metal particles and the plurality of particles of the polymer material or of the resin-based material; and
a plating layer covering the conductive resin layer,
wherein a thickness of the metal film is 1/20 to 1/3 of a diameter of a respective one of the plurality of particles of the polymer material or of the resin-based material.

15. The multilayer capacitor of claim 14, wherein the metal particles of the conductive resin layer include a spherical or flake type powder particles.

16. The multilayer capacitor of claim 14, wherein the plurality of particles of the polymer material or of the resin-based material are spherical.

17. The multilayer capacitor of claim 14, wherein the plurality of particles of the polymer material or of the resin-based material are flake type powder particles.

18. The multilayer capacitor of claim 14, wherein a portion of the plurality of particles of the polymer material or of the resin-based material is spherical, and the remainder is a flake type powder particle.

19. The multilayer capacitor of claim 14, wherein the plurality of particles of the polymer material or of the resin-based material have a diameter of 1.0 to 10.0 micrometers.

20. The multilayer capacitor of claim 14, wherein the plating layer comprises a nickel plating layer covering the conductive resin layer, and a tin (Sn) plating layer covering the nickel plating layer.

21. A multilayer capacitor comprising:
a capacitor body including a dielectric layer and a plurality of internal electrodes; and
external electrodes disposed on both ends of the capacitor body and connected to exposed portions of the plurality of internal electrodes, respectively,
wherein each of the external electrodes includes:
a conductive layer disposed on the capacitor body to be connected to the internal electrode;
a conductive resin layer covering the conductive layer, and including a plurality of metal particles, a plurality of particles of a polymer material, at least some of which have a metal film plated on a surface thereof, and a resin surrounding the plurality of metal particles and the plurality of particles of the polymer material; and
a plating layer covering the conductive resin layer, and
the metal film of one of the plurality of particles of the polymer material connects two or more of the plurality of metal particles to each other.

22. The multilayer capacitor of claim 21, wherein the metal particles of the conductive resin layer include spherical or flake type powder particles.

23. The multilayer capacitor of claim 21, wherein the metal film of the plurality of particles of the polymer material comprises at least one or more of nickel (Ni), copper (Cu), and silver (Ag).

24. The multilayer capacitor of claim 21, wherein the plurality of particles of the polymer material are spherical.

25. The multilayer capacitor of claim 21, wherein the plurality of particles of the polymer material are flake type powder particles.

26. The multilayer capacitor of claim 21, wherein a portion of the plurality of particles of the polymer material are spherical, and the remainder are flake type powder particle.

27. The multilayer capacitor of claim 21, wherein the plurality of particles of the polymer material have a diameter of 1.0 to 10.0 micrometers.

28. The multilayer capacitor of claim 21, wherein in the plurality of particles of the polymer material, the metal film is formed of an alloy by reacting with the metal particles.

29. The multilayer capacitor of claim 21, wherein the plating layer comprises a nickel plating layer covering the conductive resin layer, and a tin (Sn) plating layer covering the nickel plating layer.

* * * * *